(12) United States Patent
Wood et al.

(10) Patent No.: US 11,722,120 B1
(45) Date of Patent: Aug. 8, 2023

(54) MEMS-TUNABLE OPTICAL RING RESONATOR

(71) Applicant: National Technology & Engineering Solutions of Sandia, LLC, Albuquerque, NM (US)

(72) Inventors: Michael Wood, Albuquerque, NM (US); Alejandro J. Grine, Albuquerque, NM (US); Darwin K. Serkland, Albuquerque, NM (US); Alexander Ruyack, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 163 days.

(21) Appl. No.: 17/391,126

(22) Filed: Aug. 2, 2021

Related U.S. Application Data

(60) Provisional application No. 63/061,301, filed on Aug. 5, 2020.

(51) Int. Cl.
*H03H 9/24* (2006.01)
*B81B 3/00* (2006.01)
*H03H 9/02* (2006.01)

(52) U.S. Cl.
CPC ......... *H03H 9/2431* (2013.01); *B81B 3/0027* (2013.01); *H03H 9/02259* (2013.01); *B81B 2201/0271* (2013.01); *B81B 2201/047* (2013.01); *B81B 2203/0307* (2013.01); *B81B 2203/04* (2013.01)

(58) Field of Classification Search
CPC .............. H03H 9/2431; H03H 9/02259; B81B 3/0027; B81B 2001/0271; B81B 2001/047; B81B 2203/0307; B81B 2203/04
See application file for complete search history.

(56) References Cited

U.S. PATENT DOCUMENTS 8,542,960 B2 * 9/2013 Fattal ................. G02B 6/12007
385/32
2004/0120638 A1 * 6/2004 Frick .................... G02B 6/1225
385/27

OTHER PUBLICATIONS

Abdulla, S. M.C. et al., "Tuning a racetrack ring resonator by an integrated dielectric MEMS cantilever," Optics Express (2011) 19(17):1586415878.
(Continued)

*Primary Examiner* — Jeffrey M Shin
(74) *Attorney, Agent, or Firm* — Mark A. Dodd

(57) ABSTRACT

A microelectromechanical systems (MEMS)-tunable optical ring resonator is described herein. The ring resonator includes a resonator ring and a tuner ring, along with one or more springs. The springs may be internal or external, i.e., either within or outside the areal footprint of the resonator ring and the tuner ring. The one or more springs are configured to displace the tuner ring from the resonator ring by a desired gap based upon a desired resonant wavelength of the resonator ring. Tuning is implemented by applying a voltage to the ring resonator, with motion of the tuner ring causing a corresponding change in the effective index of the resonator ring. As the ring resonator is essentially a capacitive device, it draws very little power once tuning is achieved.

20 Claims, 7 Drawing Sheets

(56) References Cited

OTHER PUBLICATIONS

Czaplewski, D. A. et al., "RF MEMS Switches With RuO2—Au Contacts Cycled to 10 Billion Cycles," Journal of Microelectromechanical Systems (2013) 22(3):655-661.

Haffner, C. et al., "Nano-opto-electro-mechanical switches operated at CMOS-level voltages," Science (2019) 366:860-864.

Hah, D. et al., "Low-Voltage, Large-Scan Angle MEMS Analog Micromirror Arrays With Hidden vertical comb-Drive Actuators," Journal of Microelectromechanical Systems (2004) 13(2):279-289.

Li, H. et al., "A 25 Gb/s, 4.4 V-Swing, AC-Coupled Ring Modulator-Based WDM Transmitter with Wavelength Stabilization in 65 nm CMOS," IEEE Journal of Solid-State Circuits (2015) 50(12):3145-3159.

Nielson, G. N. et al., "Dynamic Pull-In of Parallel-Plate and Torsional Electrostatic MEMS Actuators," Journal of Microelectromechanical Systems (2006) 15(4):811-821.

Nielson, G. N. et al., "Integrated Wavelength-Selective Optical MEMS Switching Using Ring Resonator Filters," IEEE Photonics Technology Letters (2005) 17(6):1190-1192.

Siddiqui, A. M. et al., "Waveform Optimization for Resonantly Driven MEMS Switches Electrostatically Biased Newr Pull-in," MEMS 2018, Belfast, Northern Ireland, UK, Jan. 21-25, pp. 795-800.

\* cited by examiner

MEMS-TUNABLE OPTICAL RING RESONATOR

RELATED APPLICATIONS

This application claims priority to U.S. Provisional Application No. 63/061,301, filed on Aug. 5, 2020, and entitled MEMS-TUNABLE OPTICAL RING RESONATOR, the entirety of which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to a compact, low power, tunable optical ring resonator based on microelectromechanical system (MEMS) technology.

BACKGROUND

An optical ring resonator generally includes a segment of optical waveguide arranged as a ring-shaped, closed loop. Optical ring resonators have a variety of uses in photonic systems. For example, an optical ring resonator can be included in a photonic filter, can be included in a photonic frequency multiplexer or demultiplexer, can be included as an optical switch, can be used to adjust performance of a photonic filter, etc.

Conventionally, an optical ring resonator can be tunable, such that the wavelength of light that optically couples into the optical waveguide can be altered. Optical ring resonators have historically been tuned by altering the temperature of the optical waveguide of the optical ring resonator. Altering the temperature of the optical waveguide alters the refractive index of the material of the optical waveguide, which in turn alters the resonant wavelength of the optical waveguide. Hence, the wavelength of light that optically couples into the optical waveguide and resonates within the optical waveguide can be altered by altering the temperature of the optical waveguide. In another example, the index of refraction and resonant wavelength of the optical waveguide has conventionally been tuned by injecting current into the optical waveguide.

Tunable optical ring resonators, however, tend to require a relatively large amount of power to be tuned, and further require a relatively large amount of power to maintain a desired resonant wavelength. Other conventional tunable optical ring resonators have a relatively large areal footprint and/or require a relatively high voltage to be applied to a tuning electrode on the optical ring resonator.

SUMMARY

The following is a brief summary of subject matter that is described in greater detail herein. This summary is not intended to be limiting as to the scope of the claims.

Described herein is a tunable optical ring resonator that has a relatively small areal footprint on-chip (particularly compared to conventional microelectromechanical systems (MEMS) tunable optical ring resonators). Additionally, the tunable optical ring resonator requires less power to tune the optical ring resonator to a desired wavelength and to maintain a desired resonance wavelength when compared to conventional optical ring resonators.

The optical ring resonator described herein is a MEMS tunable optical ring resonator, wherein the index of refraction of material of the resonator ring of the optical ring resonator and resonant wavelength of the resonator ring are altered by changing the position of a tuner ring relative to the resonator ring. More specifically, the optical ring resonator includes a tuner ring and a resonator ring, wherein the tuner ring and the resonator ring have a substantially similar radius, and further wherein the tuner ring is positioned directly above the resonator ring. One or more springs, which may be internal or external, i.e., either within or outside the areal footprint of the resonator ring and the tuner ring, are configured to displace a top electrode from a bottom electrode of the ring resonator until a desired gap exists between such electrodes. The gap between the electrodes and the tuning gap between the tuner ring and the resonator ring control the effective index of refraction of the material of the resonator ring, and thus the resonant wavelength of the resonator ring.

In at least one embodiment of the present invention, a microelectromechanical systems (MEMS)-tunable optical ring resonator comprises a resonator ring (the resonator ring having a minimum free spectral range of 1 nm), a tuner ring that is positioned directly above the resonator ring (the tuner ring having a minimum free spectral range of 1 nm, the tuner ring moving in a direction normal to a plane of the resonator ring), a top electrode that is mechanically coupled to the tuner ring, a bottom electrode that is mechanically coupled to the resonator ring, and one or more springs each of which is mechanically and electrically coupled to the top electrode, a resonant wavelength of the resonator ring being tunable by applying a voltage between the top electrode and the bottom electrode.

In various embodiments, each of the one or more springs is one of an external folded spring, an external linear segment spring, an external multi-linear segment spring, an external cantilever spring, an internal folded spring, an internal linear segment spring, an internal multi-linear segment spring, or an internal cantilever spring; each of the one or more springs is an internal folded spring; the resonant wavelength of the resonator ring being tunable over a range of at least a difference between two adjacent operating wavelengths; and an effective index of the resonator ring is tunable by approximately 1% due to motion of the tuner ring.

In other embodiments, the resonator ring and the tuner ring each have an inner radius of between approximately 5 μm and approximately 15 μm; the resonator ring includes one of Si, $Si_3N_4$, $Al_2O_3$, $LiNbO_3$, or $Ta_2O_5$ and the tuner ring includes one of $SiO_2$ or $Si_3N_4$; and each of the resonator ring and the tuner ring has a height of between approximately 100 nm and approximately 500 nm, the resonator ring has a width of between approximately 0.3 μm and approximately 2.0 μm, and the tuner ring has a width of between approximately 0.3 μm and approximately 5.0 μm.

In still other embodiments, the resonator further comprises a plurality of dimples adjacent one of the top electrode or the bottom electrode; the resonator further comprises an anchor/via that is mechanically and electrically coupled to at least one of the one or more springs (the anchor/via functions as an anchor for the tuner ring and as an electrical via for the top electrode); the resonator further comprises a topside electrical contact electrically coupled to at least one of the one or more springs (the topside electrical contact functions as an electrical via for the top electrode); and the topside electrical contact includes an airbridge; the resonator further comprises at least one driver (the at least one driver changing a position of the tuner ring relative to the resonator ring).

In yet other embodiments, a spring constant of the one or more springs provides a minimum restoring force of at least 1 µN; each of the one or more springs has a thickness of between approximately 100 nm and approximately 700 nm and each of the one or more springs has a width of between approximately 0.5 µm and approximately 5 µm; the resonator further comprises an input waveguide (the input waveguide adjacent the resonator ring, the input waveguide being approximately critically optically coupled to the resonator ring, and the input waveguide including one of Si, $Si_3N_4$, $Al_2O_3$, $LiNbO_3$, or $Ta_2O_5$); the resonator further comprises a first photodiode (the first photodiode outputting a first signal indicative of a magnitude of light not coupled from the input waveguide to the resonator ring); the resonator further comprises a drop waveguide (the drop waveguide adjacent the resonator ring, the drop waveguide being approximately critically optically coupled to the resonator ring, and the drop waveguide including one of Si, $Si_3N_4$, $Al_2O_3$, $LiNbO_3$, or $Ta_2O_5$); the resonator further comprises a second photodiode (the second photodiode outputting a second signal indicative of a magnitude of light coupled from the resonator ring to the drop waveguide); and the ring resonator is a portion of one of an optical filter, a wavelength division multiplexer, or a wavelength division demultiplexer.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

DETAILED DESCRIPTION

Figure 1:
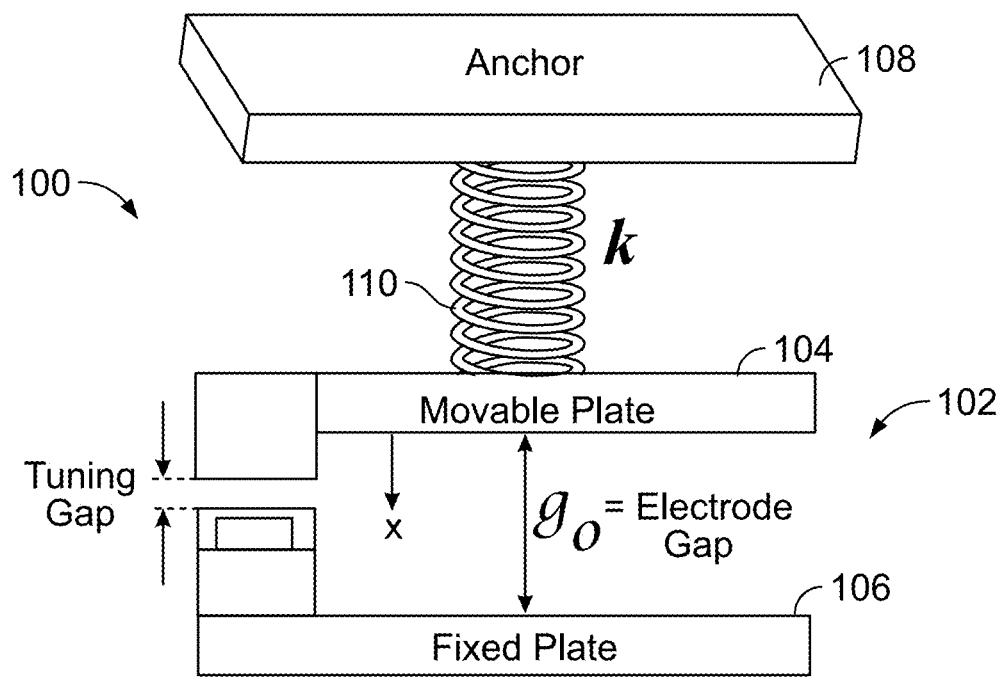
FIG. 1 is a schematic that depicts an exemplary microelectromechanical system (MEMS) tuner for an optical ring resonator.

Various technologies pertaining to a photonics transceiver with relatively high areal bandwidth density and relatively low power consumption are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, structures and devices are shown in block diagram form in order to facilitate describing one or more aspects.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Described herein is a microelectromechanical systems (MEMS) tunable optical ring resonator that exhibits various advantages over conventional optical ring resonators. The optical ring resonator described herein requires less energy to tune the optical ring resonator to a desired resonant wavelength when compared to conventional non-MEMS tunable optical ring resonators. Further, the optical ring resonator described herein has a smaller areal footprint when compared to conventional MEMS tunable optical ring resonators.

Now referring to FIG. 1, a schematic depicting an exemplary MEMS tuner 100 for an optical ring resonator is illustrated. The MEMS tuner 100 can be viewed as a capacitor 102 with a movable top electrode 104 and a fixed electrode 106, forming a gap therebetween. The gap between the two electrodes 104 and 106 (and between a tuner ring and a resonator ring, described in detail below) is voltage-controlled, and the movable electrode 104 is clamped to an anchor 108 that is mechanically coupled to a spring 110 that has a designable spring constant k. Electrostatic pull-in must be accounted for, which occurs when displacement x of the top electrode 104 is ⅓ of the original gap go. Accordingly, the electrode (air) gap of the MEMS tuner 100 must be at least three times the desired displacement range. In an exemplary embodiment, the initial electrode gap can be 3·300 nm+25% (1.125 µm). The voltage V required to achieve a desired displacement, x, is given by:

$$V = \frac{1}{\epsilon_{ox}} \sqrt{\frac{2kx(\epsilon_{air}d_{ox} + \epsilon_{ox}(d_{air} - x))^2}{\epsilon_{air}A}},$$ (Eq. 1)

where A is the overlap area of the two electrodes 104 and 106, $\epsilon_{air}$ and $\epsilon_{ox}$ are the permittivities of air and the oxide between the electrodes 104 and 106, respectively, and $d_{air}$ and $d_{ox}$ are the thicknesses of the air gap and the oxide between the electrodes 104 and 106, respectively.

A design consideration involves permanent and destructive pull-in due to stiction. A rough rule of thumb is that the spring of restoring force at pull-in should be at least 1 µN to avoid permanent stiction (assuming small area dimple contact structures without electro-migration). Stiction therefore places a lower limit on the spring stiffness.

Figure 2A:
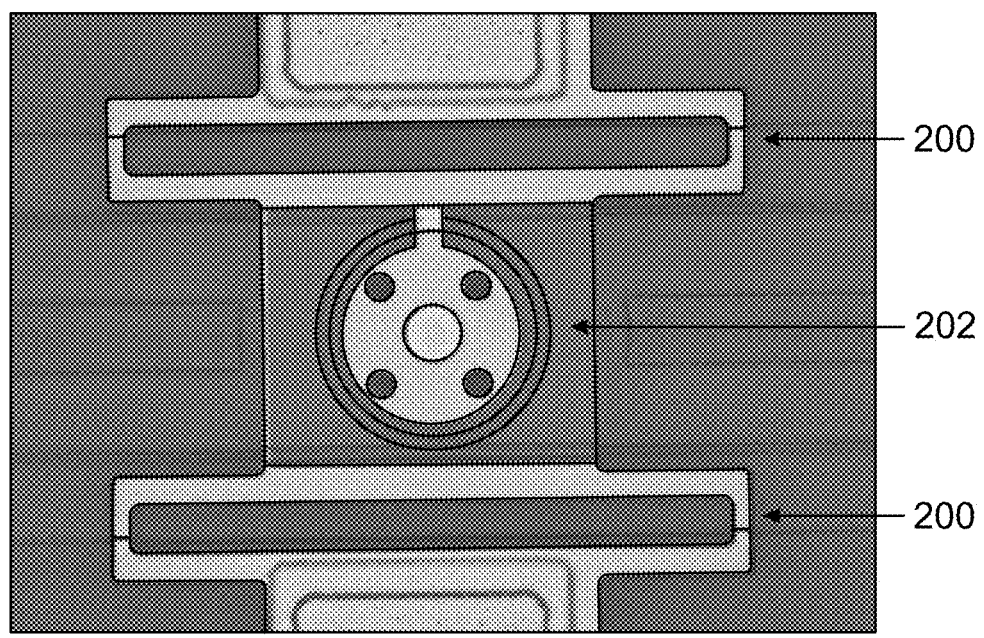
FIGS. 2A-2C are images of exemplary springs that may be employed in accordance with one or more embodiments of the present invention.
Figure 2B:
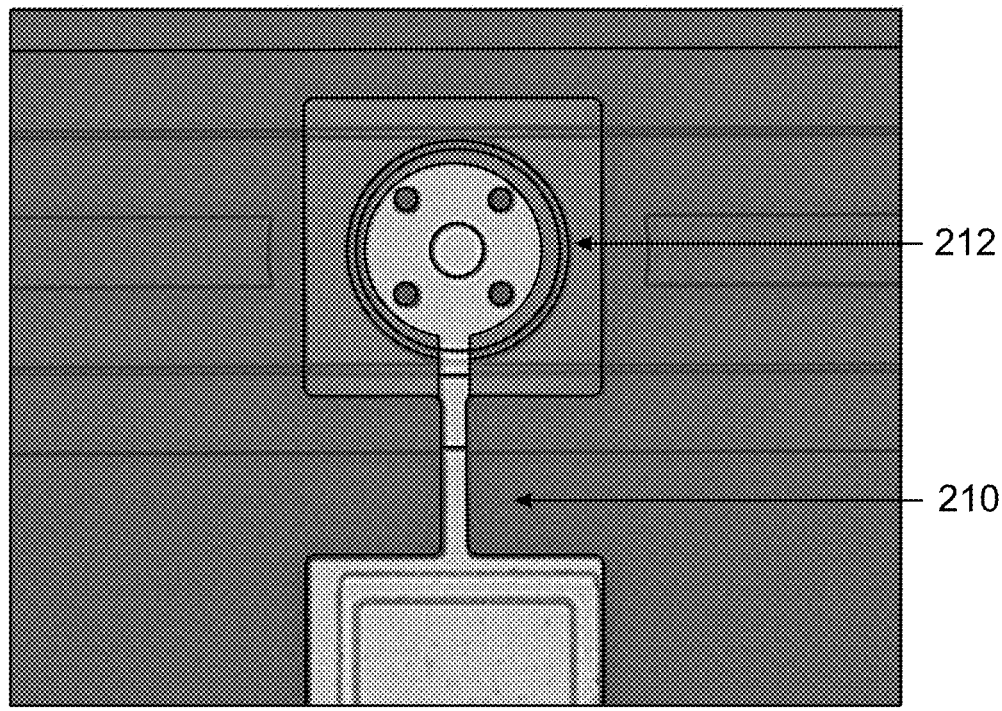
Figure 2C:
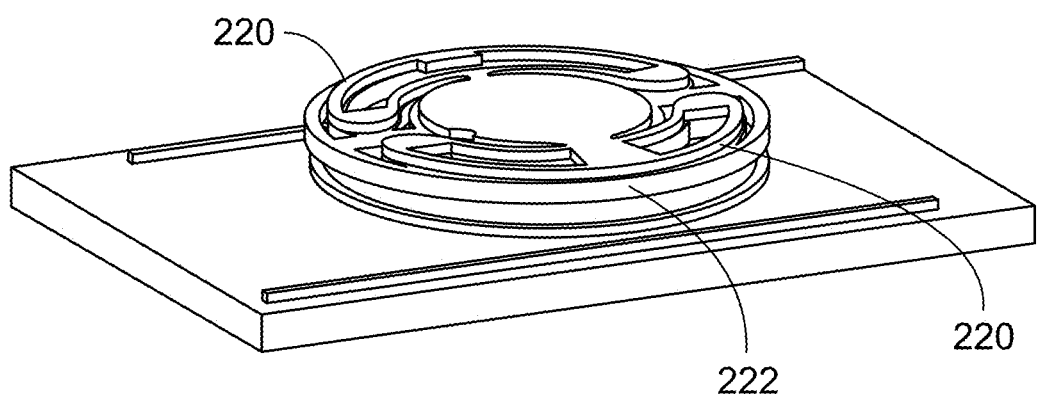
Figure 5:
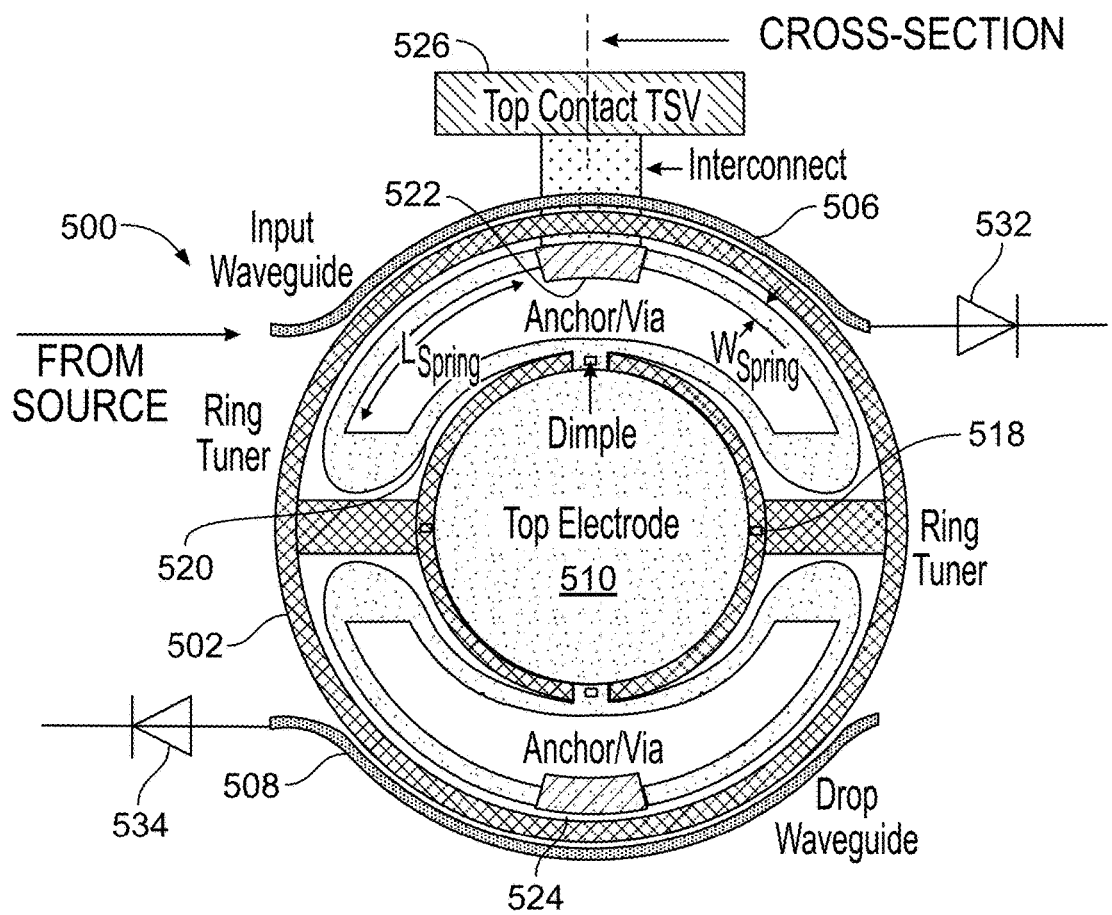
FIG. 5 is a schematic that depicts an exemplary microelectromechanical system (MEMS)-tunable optical ring resonator in accordance with one or more embodiments of the present invention.
Figure 6:
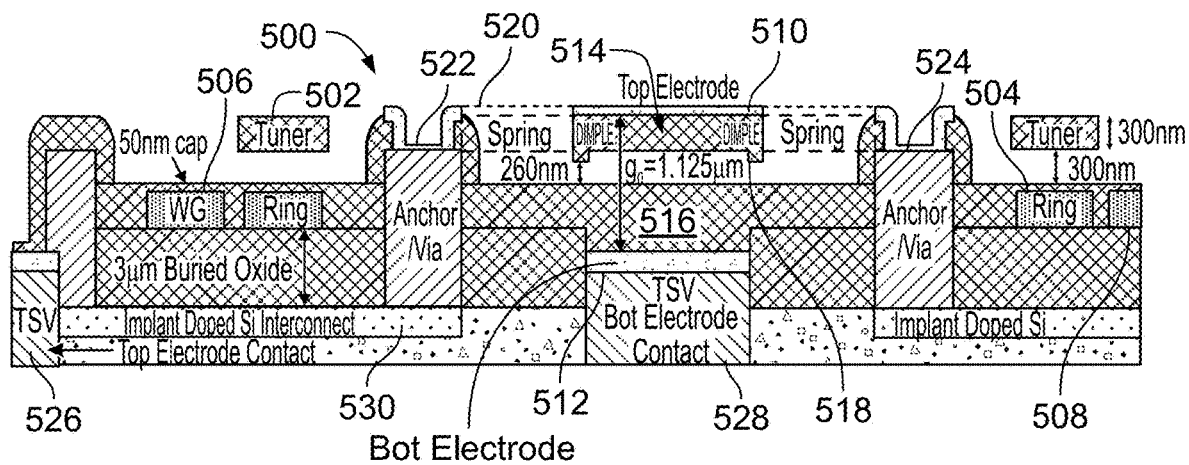
FIG. 6 is a cross-sectional view of the exemplary MEMS-tunable ring optical resonator of FIG. 5.

FIG. 2A depicts a pair of springs 200, for example, an exemplary instantiation of the spring 110, wherein the springs 200 have a folded spring design that provides strain relief due to film stress with relatively low curling. The springs 200 are called external folded springs as the springs 200 are located outside a tuner ring 202. Note that while the illustrated folded springs 200 employ linear segments, other instantiations (not illustrated) with folded springs may be formed of arced segments. While the springs 200 illustrated in FIG. 2A are formed of linear segments folded back on themselves, in other instantiations (not illustrated), the springs may be a single linear segment or may include two or more linear segments with an angle therebetween, i.e., a "multi-linear segment spring." FIG. 2B depicts a spring 210, for example, another exemplary instantiation of the spring 110, wherein the spring 210 has a cantilever spring design that provides various benefits. The benefits of this cantilever design include a lower spring constant, and thus a lower operating voltage for the same spring area, as well as eliminating one of the MEMS-waveguide crossings. Similar to the external folded springs 200, the cantilever spring 210 is located outside of a tuner ring 212, though in other instantiations (not illustrated) the cantilever spring may be located within the tuner ring 212. FIG. 2C depicts a pair of springs 220, for example, yet another exemplary instantiation of the spring 110, wherein the springs 220 have a folded spring design that provides strain relief due to film stress with relatively low curling. The utilization of the springs 220 results in a reduction in the areal footprint required for a MEMS-tunable optical ring resonator. The springs 220 are called internal folded springs as the springs 220 are located within a tuner ring 222 (FIGS. 5 and 6 illustrate similar internal folded springs 520). While the springs 220 illustrated in FIG. 2C are formed of arced segments folded back on themselves, in other instantiations (not illustrated), the springs 220 may be a single linear segment spring or a multi-linear segment spring.

The MEMS-tunable optical ring resonator described herein is capable of being operated over a wide range of temperatures (such as between 4 K and 373 K). This is an advantage over conventional ring resonators that require heating of the resonator ring for tuning, as such ring resonators are not practical in cryogenic systems due to the need for continuous heating. In contrast, the MEMS-tunable optical ring resonator described herein does not require heating, rendering it useable at cryogenic temperatures. The MEMS-tunable optical ring resonator can be included in a photonic filter, can be included in a photonic frequency multiplexer or demultiplexer, can be an optical switch, can be used to adjust performance of a photonic filter, etc. The ring resonator described herein is capable of accepting data of at least 32 Gbps, which implies an approximately 0.2 nm or larger linewidth and a quality factor Q of 5000 or less at 980 nm in waveguides with an effective index $n_{eff}$ of approximately 1.56. When the MEMS-tunable optical ring resonator is included in a wavelength division multiplexer, the multiplexer can comprise eight MEMS-tunable optical ring resonators and is therefore capable of multiplexing eight wavelength channels having a channel separation of 1 nm onto a single waveguide. This necessitates an 8 nm or larger free-spectral range (FSR) to avoid simultaneous resonance with two channels. In an example, the MEMS-tunable optical ring resonator described herein can have a FSR of 10 nm, and thus can have a radius of $$10 \ \mu m = \frac{980 \ nm^2}{2\pi n \cdot FSR}$$

or less for both the tuner ring and the resonator ring. For full flexibility, the wavelength division multiplexer should tune the resonant wavelength by an entire 10 nm FSR, which is equivalent to approximately 1% of the operating wavelength. This approximately 1% range in wavelength tuning in turn leads to a requirement of approximately 1% effective index tunability. Similarly, when the MEMS-tunable optical ring resonator is included in a wavelength division demultiplexer, the demultiplexer can comprise eight MEMS-tunable optical ring resonators and is therefore capable of demultiplexing eight wavelength channels having a channel separation of 1 nm from a single waveguide (which again necessitates 8 nm or larger FSR to avoid simultaneous resonance with two channels). As will be appreciated by those of ordinary skill, the tuning range is also a function of the overall system architecture, including, for example, the number of operating wavelengths and the wavelength spacing between the operating wavelengths. Thus, with other system architectures, the desired or required tuning range may be less than the FSR of the MEMS-tunable optical ring resonator. As will also be appreciated by those of skill in the art, the desired minimum FSR will likewise be a function of the overall system architecture. For example, the FSR for both the tuner ring and the resonator ring may preferably be at least as great as the difference between the longest and shortest operating wavelengths. In a system with a single operating wavelength, a minimum FSR of 1 nm is preferred to provide the desired degree of tunability and tuning finesse.

Figure 3:
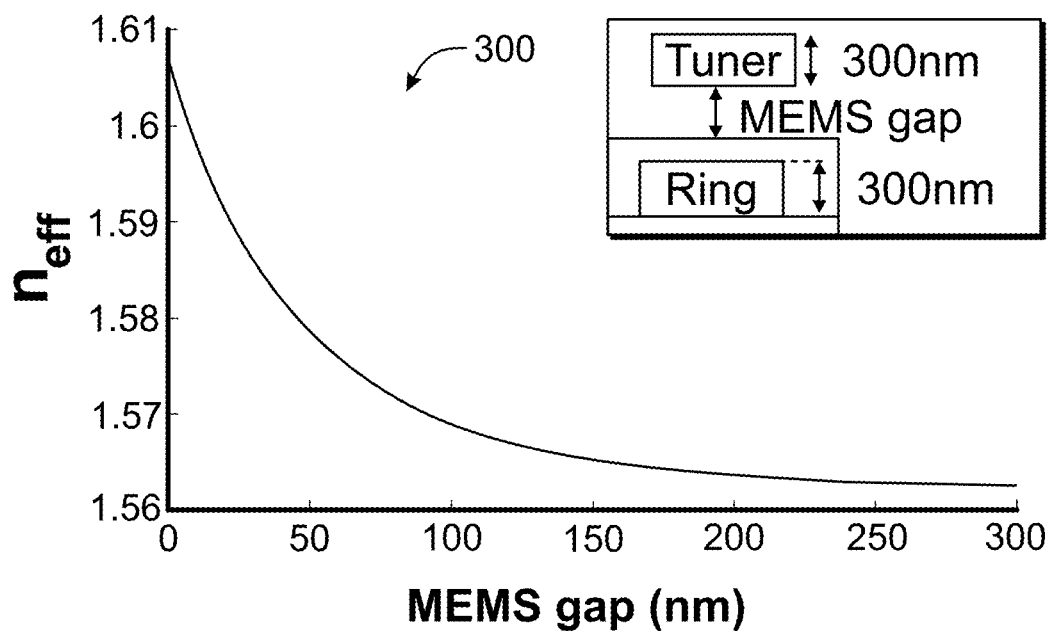
FIG. 3 is a plot that depicts silicon nitride waveguide effective index change as a function of size of a gap to a silicon dioxide tuner in accordance with one or more embodiments of the present invention.

Further, in another exemplary embodiment, the MEMS-tunable optical ring resonator can employ vertical-actuation, with the effective index of a fixed resonator ring (e.g., a $Si_3N_4$ ring) being controlled by varying a vertical tuning gap between a (moveable) tuner ring (e.g., a $SiO_2$ ring) and the $Si_3N_4$ ring. FIG. 3 is a plot 300 that depicts a simulation that illustrates the effective index tuning of the waveguide's transverse magnetic (TM) mode assuming an initial air gap of 300 nm, where the air gap can be varied from 40 to 300 nm. As illustrated, the effective index can be tuned by more than 1% over the air gap range of 40 nm to 300 nm (e.g., a 260 nm displacement).

Figure 4:
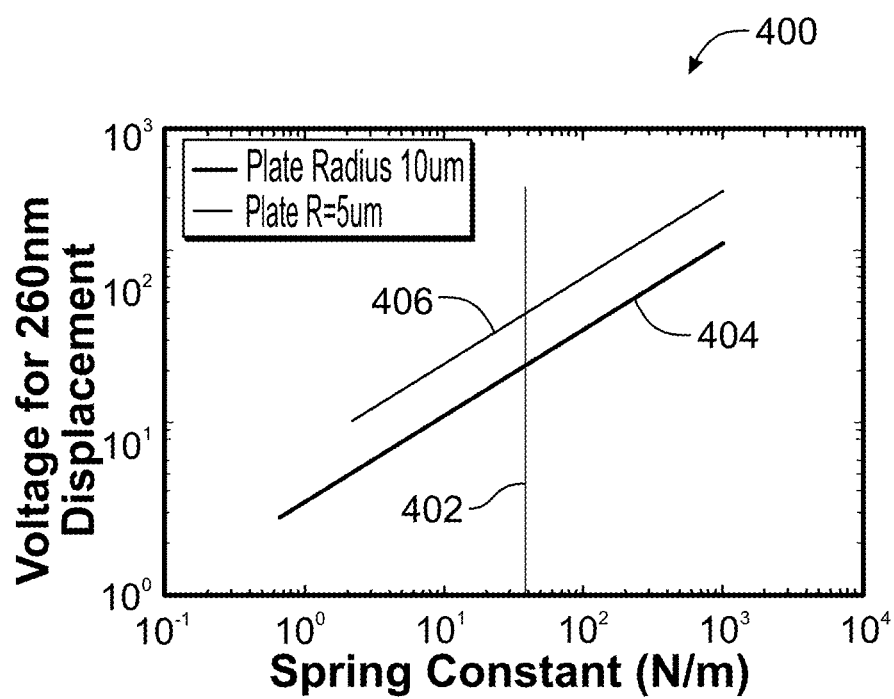
FIG. 4 is a plot that illustrates the voltage required to reach 260 nm displacement as a function of tuner spring constant for two different electrode overlap areas in accordance with one or more embodiments of the present invention.

FIG. 4 is a plot 400 that depicts the voltage required to reach the 260 nm displacement, i.e., a tunable range corresponding to the full FSR of the optical ring resonator, as a function of the tuner spring constant based upon a model of the MEMS-tunable ring resonator. The plot 400 includes a vertical line 402 that indicates the necessary spring constant to achieve a 10 µN restoring force at the 260 nm displacement. Curve 404 represents the voltage required for a first exemplary design of the MEMS-tunable ring resonator, in which the entire inner area of the MEMS-tunable ring resonator is used as an electrode with the springs being external to the ring, such as the external folded springs 200 illustrated in FIG. 2A. Curve 406 represents the voltage required for a second exemplary design of the MEMS-tunable ring resonator, in which the springs and the capacitive electrodes are enclosed within the ring (for a more compact areal footprint). With respect to the first exemplary design, a tuning voltage of approximately 20V is required, while with respect to the second exemplary design, a tuning voltage of approximately 40V is required. With respect to the second exemplary design, the required 42 N/m spring constant can be realized by 400 nm thick Au (100 nm)/SiO$_2$ (300 nm) folded springs with a length, L$_{spring}$ of 8 μm and a width of 2.5 μm. While a spring constant of 42 N/m was required for this instantiation, other instantiations may employ a spring constant between approximately 1 N/m and 100 N/m. Further, the required tuning voltage can be reduced through designs set forth in greater detail below. In other exemplary designs requiring different spring constants, the springs may have a thickness in the range of approximately 100 to 700 nm, a length of 6 to 10 μm, and a width of 0.5 to 5 μm. In certain instantiations, the optical ring resonator may not require tunability over a full FSR. Some system architectures may require tuning over just a fraction of the FSR, which may, for example, depend upon the difference between the longest and shortest operating wavelengths or upon the difference between two adjacent operating wavelengths, with the difference between two adjacent operating wavelengths preferably being the minimum tuning range.

FIG. 5 depicts a top down view of an exemplary MEMS-tunable optical ring resonator 500, and FIG. 6 depicts a cross-sectional view of the optical ring resonator 500. In an exemplary embodiment, the ring resonator 500 can be tunable over a range of 10 nm, for example, between approximately 980 nm and approximately 990 nm. In another example, the ring resonator 500 can be tunable over a range of 15 nm, for example, between approximately 975 nm and 990 nm. The ring resonator 500 includes a SiO$_2$ tuner ring 502 and a Si$_3$N$_4$ resonator ring 504 that is positioned directly below the tuner ring 502, wherein heights of both the tuner ring 502 and the resonator ring 504 are between approximately 100 nm and approximately 500 nm. In other examples, the resonator ring 504 may include Si, Al$_2$O$_3$, LiNbO$_3$, or Ta$_2$O$_5$, while the tuner ring may include Si$_3$N$_4$. In an example, the widths for the resonator ring 504 and the tuner ring 502 are approximately 0.3 μm to approximately 2.0 μm and approximately 0.3 μm to approximately 5.0 μm, respectively. In an example, the tuner ring 502 and the resonator ring 504 can have an inner ring radius of between 5 μm and 20 μm. In another example, the tuner ring 502 and the resonator ring 504 can have an inner ring radius of between 8 μm and 15 μm. In a more specific example, the tuner ring 502 and the resonator ring 504 can have an inner ring radius of approximately 10 μm. In an example, the tuner ring 502 should have an inner ring radius approximately the same as, or slightly smaller than, the inner ring radius of the resonator ring 504. In an example, the tuner ring 502 should have an outer ring radius greater than the outer ring radius of the resonator ring 504.

An input waveguide 506 is positioned adjacent the resonator ring 504, wherein the input waveguide 506 can be a Si$_3$N$_4$ waveguide, which acts as a pulley coupler and preferably approximately critically optically couples to the resonator ring 504. In other examples, the input waveguide 506 may include Si, Al$_2$O$_3$, LiNbO$_3$, or Ta$_2$O$_5$. A drop waveguide 508 (which can also be a Si$_3$N$_4$, Si, Al$_2$O$_3$, LiNbO$_3$, or Ta$_2$O$_5$ waveguide) is positioned adjacent the resonator ring 504 and on an opposite side of the resonator ring 504 as the input waveguide 506. The drop waveguide 508 is also preferably approximately critically optically coupled to the resonator ring 504.

The MEMS-tunable optical ring resonator 500 further includes a top electrode 510 and a bottom electrode 512. While the instantiation illustrated in FIG. 5 includes a buried bottom electrode 512, other instantiations may include a doped Si substrate with a backside metal contact; this combination forming an alternative bottom electrode. The ring resonator 500 additionally includes a layer 514 of polysilicon positioned directly beneath the top electrode 510 and a layer 516 of SiO$_2$, wherein a portion of the layer 516 of SiO$_2$ is positioned directly above the bottom electrode 512, and further wherein an air gap exists between the layer 514 of polysilicon and the layer 516 of SiO$_2$. The layer 514 of polysilicon has several dimples 518 (from etching) that extend approximately 40 nm from the bottom of the layer 514 of polysilicon towards the layer 516 of SiO$_2$. While the dimples 518 illustrated in FIGS. 5 and 6 are adjacent the top electrode 510, in other examples the dimples are adjacent the bottom electrode 512. A gap between the top electrode 510 and the bottom electrode 512 can initially be set to approximately 1.125 μm, with an initial gap between the dimples 518 in the layer 514 of polysilicon and the layer 516 of SiO$_2$ being approximately 260 nm. In an example, the size of the gap between the top electrode 510 and the bottom electrode 512 can be between 1 μm and 1.125 μm depending upon a voltage applied between the top electrode 510 and the bottom electrode 512. The desired size of the initial gap between the top electrode 510 and the bottom electrode 512 can be tailored based upon the thickness of the tuner ring 502, tuning voltage, and dielectric constant of non-air material (e.g., polysilicon and SiO$_2$) between the top electrode 510 and the bottom electrode 512.

The MEMS-tunable optical ring resonator 500 further comprises a pair of internal folded springs 520 (e.g., such as the springs 220 illustrated in FIG. 2C), which are designed to have a desired spring constant (e.g., 42 N/m). The springs 520, in an exemplary embodiment, can have a width W$_{spring}$ of approximately 2.5 m and length L$_{spring}$ of approximately 8 μm. As shown in FIG. 6, the springs 520 are mechanically and electrically coupled to the top electrode 514 and anchors/vias 522 and 524, wherein the anchors/vias 522 and 524 extend through the layer 516 of SiO$_2$. The anchors/vias 522 and 524 can be filled with doped polysilicon, wherein the doped polysilicon can serve as an anchor for the tuner ring 502, an electrical via, and a sacrificial layer for release of the ring resonator 500 under dry etching. The anchor/via functionality is maintained by protecting the anchors/vias 522 and 524 with SiO$_2$ and top-side Au prior to release. Electrical accesses to the ring resonator 500 are by way of the anchors/vias 522 and 524, and further by way of TSVs 526 and 528, with an implant doped Si interconnect 530 between the anchors/vias 522 and 524 and the TSV 526. The dimples 518 are included in the ring resonator 500 to prevent stiction in the event that the springs 520 pull-in. The ring resonator 500 can optionally include a low stiction contact material, such as sputtered Ruthenium, deposited on and/or below the dimples 518.

In other exemplary embodiments, topside electrical contacts (not illustrated), as opposed to TSVs 526 and 528, are employed and provide electrical access to the top electrode 510 and the bottom electrode 512 of the MEMS-tunable optical ring resonator 500. These topside electrical contacts may include air bridges over one or more features, for example, the tuner ring 502, the input waveguide 506, and/or the drop waveguide 508. In yet other exemplary embodiments, the ring resonator 500 includes both TSVs 526 and 528 and the topside electrical contacts for maximum design flexibility.

In an exemplary embodiment, a first photodiode 532 can optionally be optically coupled to the input waveguide 506 and a second photodiode 534 can optionally be optically coupled to the drop waveguide 508, the MEMS-tunable optical ring resonator 500 can be tuned based upon the output(s) of the first photodiode 532 and/or the second photodiode 534.

In systems where the MEMS-tunable ring resonator 500 may be employed (e.g., a filter, a multiplexer, a demultiplexer, etc.), the ring resonator 500 is configured to set the resonance wavelength to a fixed wavelength or track a slowly varying wavelength (e.g., locking to a wavelength of a laser that is thermally drifting at millisecond timescales or slower). Conventional optical ring resonators use thermal phase shifters for this task, where thermal phase shifters constantly draw power to fix the resonance wavelength—both during the initial active lock process and to maintain the temperature required for lock. In like manner, carrier injection phase shifters constantly draw power due to the current injection required to fix the resonance wavelength—both during the initial active lock process and to maintain lock. Put differently, both thermal phase shifters and carrier injection phase shifters are effectively resistors. The ring resonator 500 is capacitive in nature, and thus the ring resonator 500 only draws power when the capacitor is charged/discharged to change the location of the tuner ring 502 during wavelength locking. Once the resonance of the resonator ring 504 is at the desired wavelength, no power need be drawn to maintain the resonance wavelength, and it therefore can be said that the quiescent power draw is zero (or near zero) for the ring resonator 500. This is particularly advantageous over conventional ring resonators in environments where temperatures vary slowly relative to Gb/s data transmission rates, since the required power draw is fairly low overhead. In addition, the ring resonator 500 is particularly advantageous over conventional ring resonators in cryogenic environments where it is undesirable to add any additional heat to the chamber. The ring resonator 500 also exhibits advantages over conventional capacitive tunable optical ring resonators, which typically are optically lossy, and reverse biased p-n junction tunable optical ring resonators, which typically can tune over just a small fraction of the FSR.

Exemplary operation of the MEMS-tunable optical ring resonator 500 is now set forth. The input waveguide 506 carries light from a light source towards the ring resonator 500, wherein the light has an operating wavelength, and further wherein the light is desirably optically coupled into the resonator ring 504 of the ring resonator. A gap of an initial size exists between the top electrode 510 and the bottom electrode 512, wherein the initial size of the gap corresponds to an initial index of refraction (and therefore an initial resonant wavelength) of the resonator ring 504. Light of the initial resonant wavelength optically couples into the resonator ring 504 and subsequently optically couples into the drop waveguide 508. The first photodiode 532 receives light on the input waveguide 506 that has not optically coupled into the resonator ring 504 and outputs a first electrical signal that is indicative of a magnitude of the light that has not optically coupled into the resonator ring 504. The second photodiode 534 receives light on the drop waveguide 508 that was optically coupled into the resonator ring 504 and outputs a second electrical signal that is indicative of a magnitude of the light that was optically coupled into the resonator ring 504.

Based upon the first electrical signal or the second electrical signal, the MEMS-tunable ring resonator 500 can be tuned by altering the size of the gap between the top electrode 510 and the bottom electrode 512. By altering the size of the gap between the top electrode 510 and the bottom electrode 512, the index of refraction of the material of the resonator ring 504 is likewise altered. This altering of the index of refraction of the material of the resonator ring 504 can be used to alter the resonant wavelength of the resonator ring 504 to match the operating wavelength of the light from the light source. A voltage is applied between the top and bottom electrodes 510 and 512, thereby pulling the tuner ring 502 towards the resonator ring 504 or pushing the tuner ring 502 away from the resonator ring 504. Thus, the ring resonator 500 can be tuned to the operating wavelength.

In an exemplary embodiment, the tuning voltage for the MEMS-tunable ring resonator 500 may be approximately 40 V. In another exemplary embodiment, the tuning voltage may be approximately 20 V or less. For example, a MEMS-tunable ring resonator employing a cantilever design in accordance with FIG. 2B with a 10 μm radius demonstrated tunability over more than its FSR with a voltage of less than 15 V. In yet other embodiments, the tuning voltage can be between 3 V and 6 V. This relatively low tuning voltage can be accomplished by, for example, using various alternative configurations. For example, an exemplary embodiment uses vertical comb drives, which employ control voltages in the 6 V range. Another exemplary embodiment uses relatively low spring constant structures enabled by low stiction dimples and contact materials. Yet another exemplary embodiment uses resonant switches that take advantage of the switch quality factor and DC bias amplification. A further exemplary embodiment uses a less confined, lower index contrast structures such as relatively thin waveguides and ridge-waveguides. A still further exemplary embodiment uses a relatively small resonator ring 504 radius to increase optical field overlap with the tuner ring 502. In contrast to previous demonstrations of optical MEMS tuning of integrated optics, the ring resonator 500 depicted in FIGS. 5 and 6 leads to better scalability to larger aggregate bit rates, while the low insertion loss, cross-talk, and low power are advantages over non-MEMS approaches.

The use of a tuner ring 502 that moves in a direction normal to the plane formed by the resonator ring 504, especially one in which the springs 520 are directly coupled to the tuner ring 502, contrasts with various prior art MEMS-tunable ring resonators. For example, Haffner, et al., discloses a MEMS-tunable ring resonator that employs a gold disk-shaped membrane suspended over a fixed resonator ring via a fixed pedestal located in the middle of the resonator ring. Haffner, et al., "Nano-opto-electro-mechanical switches operated at CMOS-level voltages," Science, Vol. 366, November 2019, pages 860-864, the entirety of which is incorporated herein by reference. Nielson, et al., discloses a MEMS-tunable ring resonator that employs an aluminum rectangular-shaped membrane suspended over a fixed resonator ring via fixed risers at both long ends of the rectangular-shaped membrane, with the risers being located outside of the resonator ring. Nielson, et al., "Integrated Wavelength-Selective Optical MEMS Switching Using Ring Resonator Filters," IEEE Photonics Technology Letters, Vol. 17, No. 6, June 2005, pages 1190-1192, the entirety of which is incorporated herein by reference. Abdullah, et al., discloses a MEMS-tunable ring resonator that employs a gold coated dielectric rectangular-shaped membrane suspended over a fixed resonator ring via a fixed riser at one of the long ends of the rectangular-shaped membrane, with the riser being located outside of the resonator ring. Abdulla, et al., "Tuning a racetrack ring resonator by an integrated dielectric MEMS cantilever," Optics Express, Vol. 19, No. 17, August 2011, pages 15864-15878, the entirety of which is incorporated herein by reference.

Figure 7:
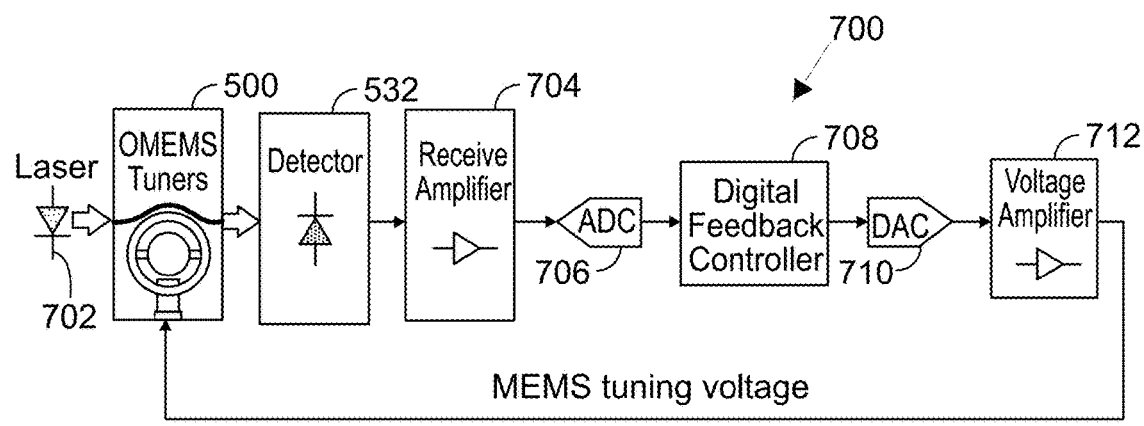
FIGS. 7 and 8 depict exemplary circuits that can be employed to control a MEMS-tunable optical ring resonator in accordance with one or more embodiments of the present invention.

FIG. 7 is a schematic of an exemplary circuit 700 that can be employed to control the MEMS-tunable ring resonator 500. The circuit 700 can be configured to lock the resonant wavelength of the ring resonator 500 to a desired wavelength (e.g., light output by a laser 702) by altering the gap between the tuner ring 502 and the resonator ring 504. The photodetector 532 detects light that was not coupled to the ring resonator 500. The circuit 700 comprises a receive amplifier 704 that converts a photocurrent output by the photodetector 532 to a voltage. In an exemplary embodiment, the receive amplifier 704 can be a transimpedance amplifier or a CMOS charge pump, depending upon the desired power consumption, sensitivity, and bandwidth. An analog-to-digital converter (ADC) 706 is electrically coupled to the receive amplifier 704, and a digital feedback controller 708 is electrically coupled to the output of the ADC 706. The controller 708 can be a microcontroller, a field programmable gate array (FPGA), etc. The controller 708 is programmed to determine a wavelength offset and output a necessary voltage to a digital-to-analog converter (DAC) 710. The circuit 700 further includes a voltage amplifier 712 that is electrically coupled to the output of the DAC 710, wherein the voltage amplifier 712 is configured to amplify voltage output by the DAC 710 and direct the voltage to the control terminal of the MEMS-tunable ring resonator 500.

The digital feedback controller 708 can include a look-up table that is usable to identify a new voltage based upon the voltage output by the ADC 706 and a previous voltage. Further, the controller 708 can include a proportional, integral, and derivative gain (PID) control algorithm or a PID chip. It can be noted that when maximizing coupling to the resonator ring 504 is desired, wavelength locking can be obtained by minimizing the signal from the photodetector 532. In another exemplary embodiment, the circuit 700 can include the photodetector 534 in place of the photodetector 532. In such an embodiment, wavelength locking is obtained by maximizing the signal from the photodetector 534.

Figure 8:
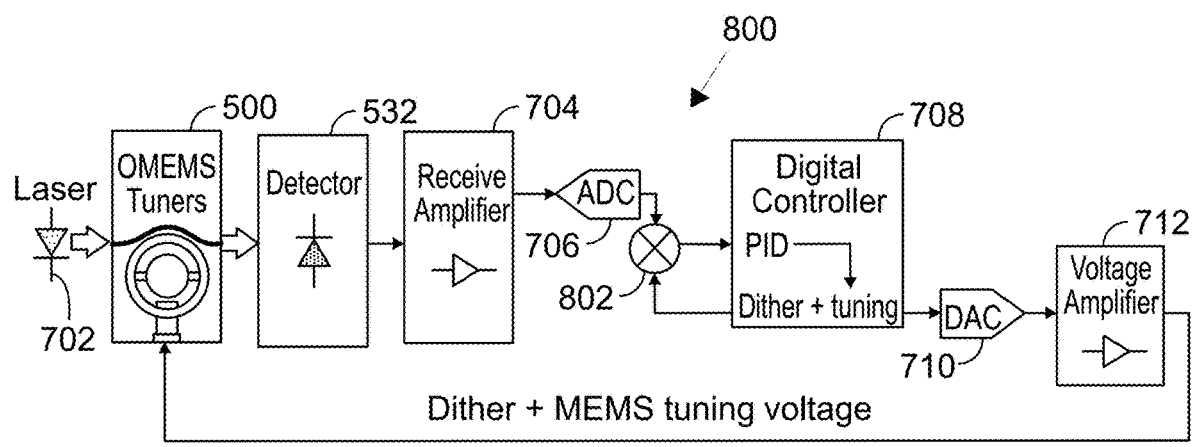

The tuning algorithm can include a simple lookup table, dither and lock technique, Pound-Drever-Hall locking, or a Sigma-Delta locking technique for precise control. Since the detected photocurrent is the same both slightly above and below resonance, the slop of the detected signal versus time are used in addition to amplitude. FIG. 8 depicts an exemplary circuit 800 that includes locking electronics for a dither and lock technique. In the exemplary circuit 800, the control voltage applied to the control terminal of the ring resonator 500 includes a rapidly varying dither between a high and a low voltage, plus a slowly varying tuning voltage offset. By dithering the tuning voltage, the slope of the received signal can be determined in addition to the magnitude. The dither plus the tuning voltage can be multiplied (by a multiplier 802) with the received photocurrent to generate an error signal, which is on average zero exactly on-resonance and non-zero off-resonance. The digital controller 708 determines the average and determines a new tuning setpoint using a PID circuit within the controller 708. To control multiple MEMS-tunable ring resonators, analog multiplexers can be utilized preceding the ADC 706 and an analog demultiplexer can follow the DAC 710. It can be noted existing chip manufacturers manufacture a sample and hold array that combines the functionality of an analog demultiplexer and voltage amplifier. Li, et al., "A 25 Gb/s, 4.4 V-Swing, AC-Coupled Ring Modulator-Based WDM Transmitter With Wavelength Stabilization in 65 nm CMOS," IEEE Journal of Solid-State Circuits, Vol. 50, No. 12, December, 2015, pages 3145-3159 makes reference to exemplary technologies for controlling voltage applied to ring modulators, wherein such techniques can be employed in connection with controlling the MEMS-tunable ring resonator 500. The entirety of such paper is incorporated herein by reference.

Figure 9:
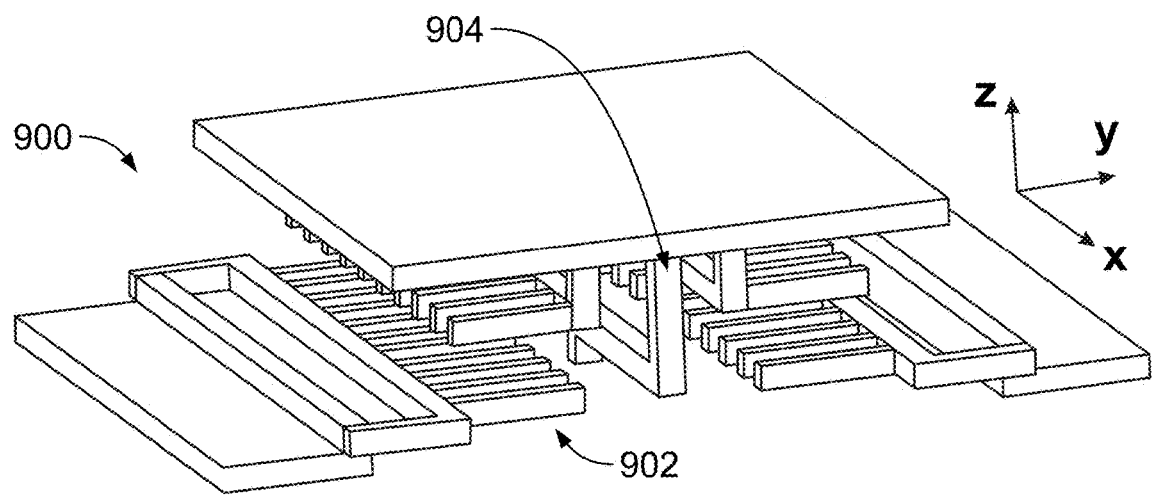
FIGS. 9 and 10 depict exemplary MEMS comb drives that can be employed to actuate a MEMS-tunable optical ring resonator in accordance with one or more embodiments of the present invention.
Figure 10:
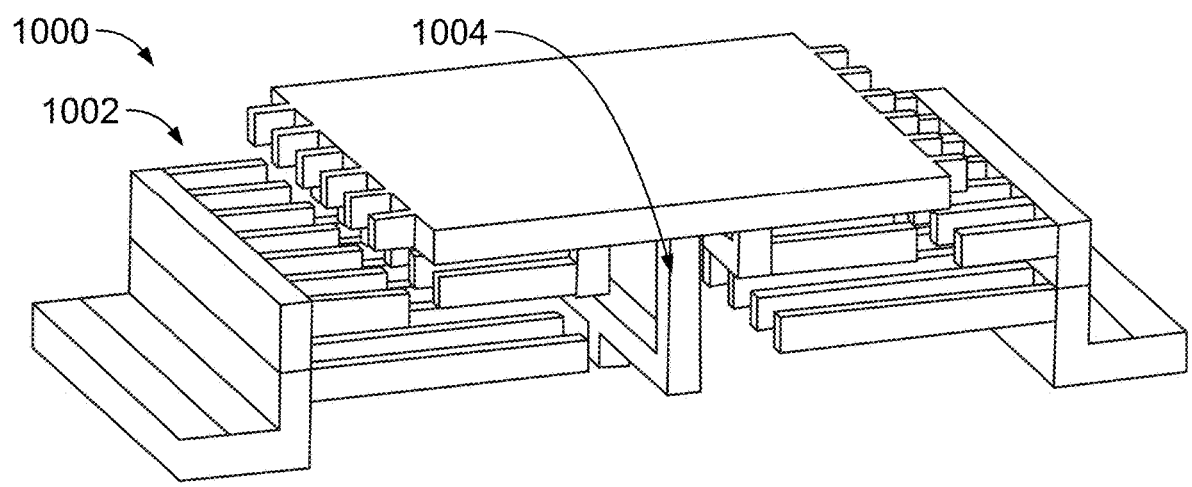

FIG. 9 depicts a MEMS-tunable mirror 900, wherein the MEMS-tunable mirror 900 includes an exemplary single-layer vertical comb drive 902 that is configured to actuate a spring 904. A vertical comb drive that is similar to the vertical comb drive 902 depicted in FIG. 9 can be employed to actuate the springs 520 such that the tuner ring 502 is positioned as desired relative to the resonator ring 504 in a MEMS-tunable ring resonator 500. FIG. 10 is a diagram of another MEMS-tunable mirror 1000, wherein the MEMS-tunable mirror 1000 includes an exemplary two-layer vertical comb drive 1002 that is configured to actuate a spring 1004. A vertical comb drive that is similar to the vertical comb drive 1002 depicted in FIG. 10 can be employed to actuate the springs 520 such that the tuner ring 502 is positioned as desired relative to the resonator ring 504 in a ring resonator 500. The vertical comb drives 902 and 1002 are described in Hah, et al., "Low-Voltage, Large-Scan Angle MEMS Analog Micromirror Arrays with Hidden Vertical Comb-Drive Actuators," Journal of Microelectromechanical Systems, Vol. 13, No. 2, pages 279-289, April 2004, the entirety of which is incorporated herein by reference.

Figure 11:
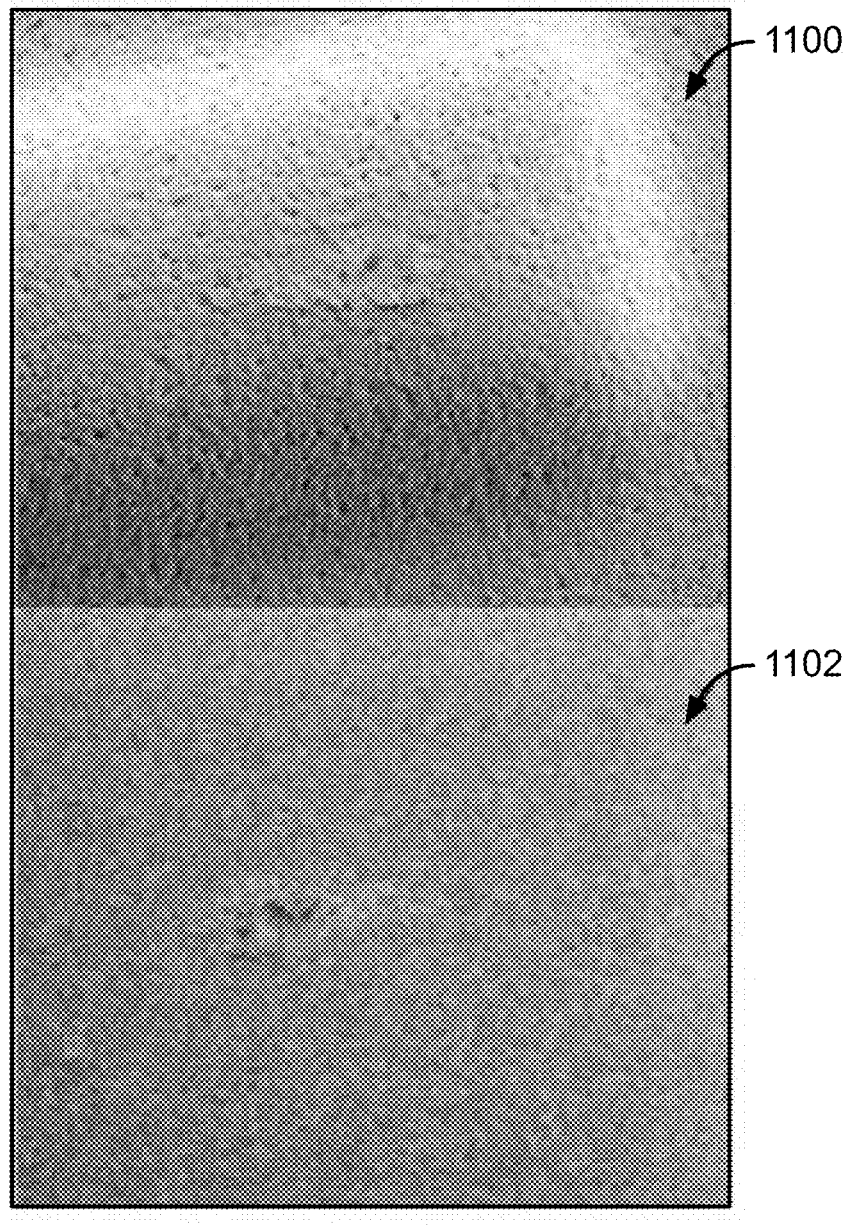
FIG. 11 is an optical micrograph illustrating exemplary dimples/low stiction contacts that can be employed in a MEMS-tunable optical ring resonator in accordance with one or more embodiments of the present invention.

FIG. 11 depicts optical micrographs illustrating exemplary dimple 1100/low stiction contact 1102 that can be employed in connection with actuating the tuner ring 502. The exemplary dimple 1100/low stiction contact 1102 are described in Czaplewski, et al., "RF MEMS Switches With $RuO_2$—Au Contacts Cycled to 10 Billion Cycles," Journal of Microelectromechanical Systems, Vol. 22, No. 3, pages 655-661, June 2013, the entirety of which is incorporated herein by reference.

Nielson, et al., "Dynamic Pull-In of Parallel Plate and Torsional Electrostatic MEMS Actuators," Journal of Microelectromechanical Systems, Vol. 15, No. 4, pages 811-821, August 2006, discloses an analysis of the dynamic characteristics of pull-in on parallel-plate and torsional electrostatic actuators, which can be employed to reduce the voltage required to alter position of the tuner ring 502 relative to the resonator ring 504 in a MEMS-tunable ring resonator 500. The entirety of such paper is incorporated herein by reference. Siddiqui et al., "Waveform Optimization for Resonantly Driven MEMS Switches Electrostatically Biased Near Pull-In," 2018 IEEE Micro Electro Mechanical Systems (MEMS), Belfast, pages 795-800, 2018, describes a resonant switch that can be employed to reduce the voltage required to alter position of the tuner ring 502 relative to the resonator ring 504 in a MEMS-tunable ring resonator 500. The entirety of such paper is incorporated herein by reference.

The invention may be embodied in other specific forms without departing from its spirit or essential characteristics.

The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A microelectromechanical systems (MEMS)-tunable optical ring resonator comprising:
   a resonator ring adapted to have a minimum free spectral range of 1 nm;
   a tuner ring that is positioned directly above the resonator ring, the tuner ring adapted to have a minimum free spectral range of 1 nm, the tuner ring adapted to move in a direction normal to a plane of the resonator ring;
   a top electrode that is mechanically coupled to the tuner ring;
   a bottom electrode that is mechanically coupled to the resonator ring; and
   one or more springs each of which is mechanically and electrically coupled to the top electrode;
   wherein a resonant wavelength of the resonator ring is tunable by applying a voltage between the top electrode and the bottom electrode.

2. The MEMS-tunable optical ring resonator of claim 1, wherein each of the one or more springs is one of an external folded spring, an external linear segment spring, an external multi-linear segment spring, an external cantilever spring, an internal folded spring, an internal linear segment spring, an internal multi-linear segment spring, or an internal cantilever spring.

3. The MEMS-tunable optical ring resonator of claim 2, wherein each of the one or more springs is an internal folded spring.

4. The MEMS-tunable optical ring resonator of claim 1, wherein the resonant wavelength of the resonator ring is tunable over a range of at least a difference between two adjacent operating wavelengths.

5. The MEMS-tunable optical ring resonator of claim 1, wherein an effective index of the resonator ring is adapted to be tuned by approximately 1% due to motion of the tuner ring.

6. The MEMS-tunable optical ring resonator of claim 1, wherein the resonator ring and the tuner ring each have an inner radius of between approximately 5 μm and approximately 15 μm.

7. The MEMS-tunable optical ring resonator of claim 1,
   wherein the resonator ring includes one of Si, $Si_3N_4$, $Al_2O_3$, $LiNbO_3$, or $Ta_2O_5$; and
   wherein the tuner ring includes one of $SiO_2$ or $Si_3N_4$.

8. The MEMS-tunable optical ring resonator of claim 1,
   wherein each of the resonator ring and the tuner ring has a height of between approximately 100 nm and approximately 500 nm;
   wherein the resonator ring has a width of between approximately 0.3 μm and approximately 2.0 μm; and
   wherein the tuner ring has a width of between approximately 0.3 μm and approximately 5.0 μm.

9. The MEMS-tunable optical ring resonator of claim 1, further comprising a plurality of dimples adjacent one of the top electrode or the bottom electrode.

10. The MEMS-tunable optical ring resonator of claim 1,
    further comprising an anchor/via that is mechanically and electrically coupled to at least one of the one or more springs;
    wherein the anchor/via functions as an anchor for the tuner ring and as an electrical via for the top electrode.

11. The MEMS-tunable optical ring resonator of claim 1,
    further comprising a topside electrical contact electrically coupled to at least one of the one or more springs;
    wherein the topside electrical contact functions as an electrical via for the top electrode.

12. The MEMS-tunable optical ring resonator of claim 11, wherein the topside electrical contact includes an airbridge.

13. The MEMS-tunable optical ring resonator of claim 1, further comprising at least one driver, the at least one driver adapted to change a position of the tuner ring relative to the resonator ring.

14. The MEMS-tunable optical ring resonator of claim 1, wherein a spring constant of the one or more springs is adapted to provide a minimum restoring force of at least 1 μN.

15. The MEMS-tunable optical ring resonator of claim 1,
    wherein each of the one or more springs has a thickness of between approximately 100 nm and approximately 700 nm; and
    wherein each of the one or more springs has a width of between approximately 0.5 μm and approximately 5 μm.

16. The MEMS-tunable optical ring resonator of claim 1, further comprising an input waveguide, the input waveguide adjacent the resonator ring, the input waveguide adapted to be approximately critically optically coupled to the resonator ring, and the input waveguide including one of Si, $Si_3N_4$, $Al_2O_3$, $LiNbO_3$, or $Ta_2O_5$.

17. The MEMS-tunable optical ring resonator of claim 16, further comprising a first photodiode adapted to output a first signal indicative of a magnitude of light not coupled from the input waveguide to the resonator ring.

18. The MEMS-tunable optical ring resonator of claim 1, further comprising a drop waveguide, the drop waveguide adjacent the resonator ring, the drop waveguide adapted to be approximately critically optically coupled to the resonator ring, and the drop waveguide including one of Si, $Si_3N_4$, $Al_2O_3$, $LiNbO_3$, or $Ta_2O_5$.

19. The MEMS-tunable optical ring resonator of claim 18, further comprising a second photodiode adapted to output a second signal indicative of a magnitude of light coupled from the resonator ring to the drop waveguide.

20. The MEMS-tunable optical ring resonator of claim 1, wherein the MEMS-tunable optical ring resonator is a portion of one of an optical filter, a wavelength division multiplexer, or a wavelength division demultiplexer.

* * * * *